United States Patent [19]

Spence

[11] 3,714,466

[45] Jan. 30, 1973

[54] CLAMP CIRCUIT FOR BOOTSTRAP FIELD EFFECT TRANSISTOR

[75] Inventor: John R. Spence, Villa Park, Calif.

[73] Assignee: North American Rockwell Corporation, El Segundo, Calif.

[22] Filed: Dec. 22, 1971

[21] Appl. No.: 210,660

[52] U.S. Cl. ....................307/237, 307/251, 307/304

[51] Int. Cl. ....................H03k 5/08

[58] Field of Search ....................307/237, 251, 304

[56] References Cited

UNITED STATES PATENTS

| | | | |
|---|---|---|---|
| 3,506,851 | 4/1970 | Polkinghorn et al. | 307/304 X |
| 3,619,670 | 11/1971 | Heimbigner | 307/304 |
| 3,622,798 | 11/1971 | Ochi | 307/251 X |
| 3,629,618 | 12/1971 | Fujimoto | 307/304 X |
| 3,631,267 | 12/1971 | Heimbigner | 307/237 X |
| 3,649,843 | 3/1972 | Redwine et al. | 307/304 X |

*Primary Examiner*—Stanley D. Miller, Jr.
*Assistant Examiner*—R. C. Woodbridge
*Attorney*—L. Lee Humphries et al.

[57] ABSTRACT

A clamp field effect transistor is connected between the gate electrode of a bootstrap driver circuit and a voltage level. The clamp becomes responsive to voltage levels fed-back to the gate electrode of said driver circuit for clamping the voltage on the gate electrode to a level which holds the driver circuit off when the output voltage level from the driver circuit becomes approximately equal to the first voltage level. As a result, the voltage level at the output of the driver circuit can be increased in magnitude for providing a relatively higher voltage for driving other circuits.

6 Claims, 1 Drawing Figure

PATENTED JAN 30 1973
3,714,466
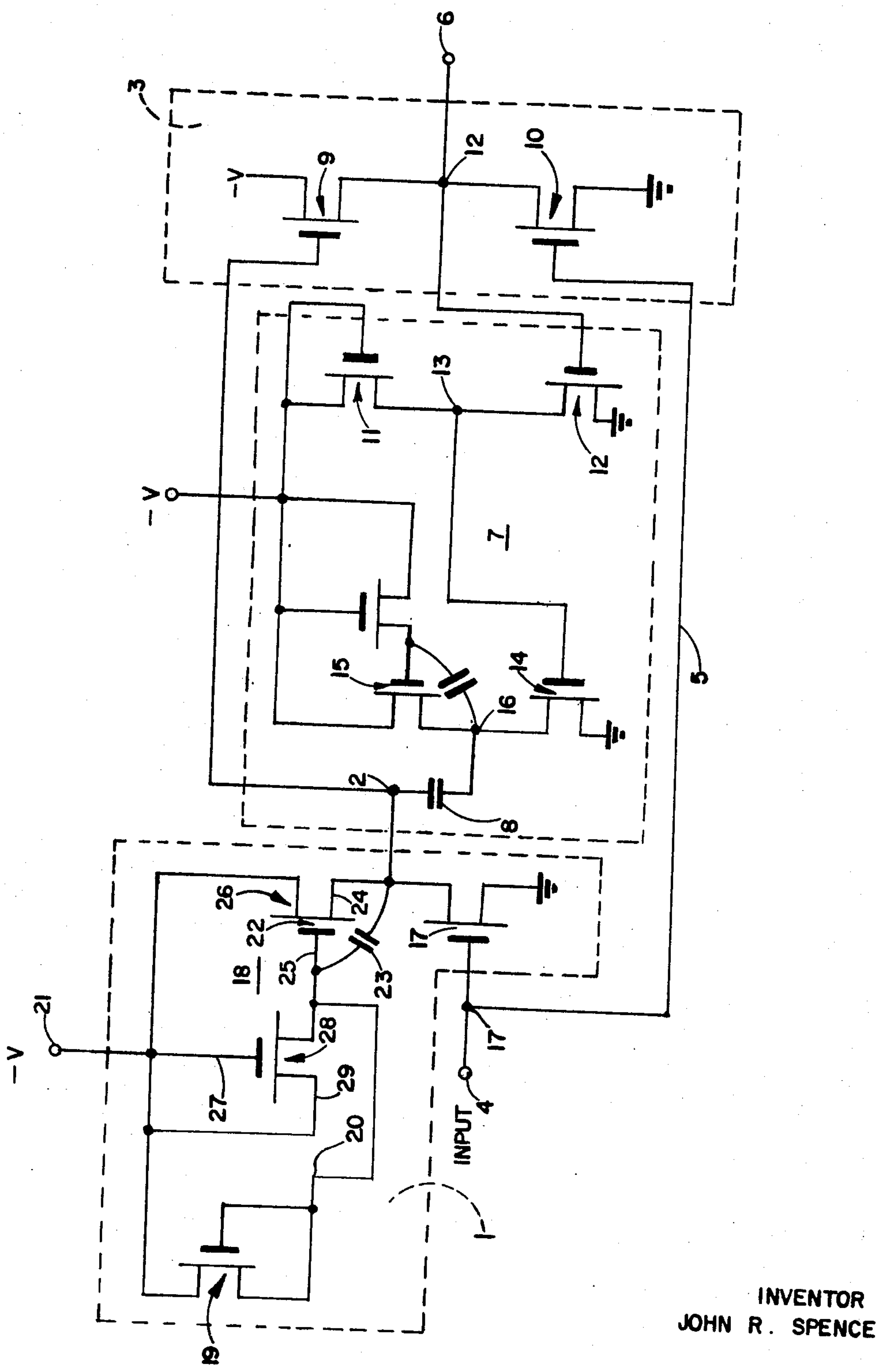
INVENTOR
JOHN R. SPENCE
BY Robert G. Rogers
ATTORNEY

CLAMP CIRCUIT FOR BOOTSTRAP FIELD EFFECT TRANSISTOR

BACKGROUND OF THE INVENTION

1. Field of the Invention

The invention relates to a clamp circuit for a bootstrap driver circuit and more particularly to such a clamp circuit which holds the driver circuit off for enabling a voltage level at the output of the driver circuit to increase to a substantially higher level than would be possible if the driver circuit had been implemented with a normal bootstrap circuit.

2. Description of Prior Art

An example of a bootstrap driver with a feedback control circuit can be seen by referring to patent application Ser. No. 047,477 filed June 18, 1970 by Gary Lee Heimbigner, now U.S. Pat. No. 3,631,267, entitled Bootstrap Driver Feedback Control Circuit. The application will issue as a patent shortly. The bootstrap driver responds to voltage levels on an input representing true or false logic states for controlling the output voltage taken from a common point between a push-pull output stage.

The true voltage levels at the output are fedback through a control circuit for boosting the voltage on the gate electrode of a first field effect transistor of the push-pull output. The first field effect transistor is on when the input is false. When the input is true, the second field effect transistor of the push-pull output stage is on. The feedback voltage from the output provides a relatively increased drive voltage for the first field effect transistor whereby the output voltage level is driven to approximately the voltage level of the voltage source for the push-pull output stage. The control circuit provides a feedback voltage for overcoming the threshold losses through the field effect transistors of the bootstrap driver circuit.

For purposes of describing one embodiment of the circuit, it is assumed that the field effect transistors are P-channel devices which are turned on by negative voltage levels representing true logic states. N-channel devices using positive voltage levels to represent true states could also be used. In addition, the logic convention could be changed as appropriate. It is also assumed that the normal voltage source is approximately 25 volts and that the field effect transistors have a threshold drop of approximately 6 to 8 volts.

When the input to the referenced circuit is evaluated, one threshold drop occurs across the load transistor comprising part of the input stage. The source voltage level, reduced by one threshold, is applied to the gate electrode of the first field effect transistor of the push-pull output stage. As a result, the voltage level at the output is reduced by two threshold voltage levels from the voltage source. The voltage is fedback across a control circuit identified generally by numeral 14 in FIG. 1 and shown in more detail in FIG. 2. The feedback voltage boosts the voltage across capacitor 15 at point 17 for increasing the drive voltage on the gate electrode of the first field effect transistor (identified by numeral 2). As a result, the drive voltage is increased to a voltage level more negative by at least one threshold than the voltage level of the voltage source. The threshold drop across the first field effect transistor is overcome and the output is driven to the voltage level of the voltage source.

In certain necessary the voltage level of a voltage source drops. In other words, instead of being approximately −25 volts, the voltage level may drop to approximately −18 volts. Sometimes the lower operating voltage level is necessary for a particular application and sometimes the drop is attributable to circuit limitations. When the voltage level drops, such that the voltage at the output is reduced by two thresholds from the now reduced voltage level of the voltage source, the output voltage level is insufficient to cause the feedback circuit to become responsive. Therefore, the output remains at a substantially reduced voltage level, e.g., the voltage source reduced by two threshold voltage levels, The output voltage may be insufficient to provide drive voltage for a subsequent circuit stage.

If the threshold drop across the load field effect transistor associated with the input stage could be overcome, the feedback control circuit would remain operative even when the voltage level of the voltage source is reduced. By overcoming the threshold drop across the field effect transistor and the input stage, the circuit can be used for low voltage level applications. The present application described a circuit which enables the voltage source to be reduced without impairing circuit operations.

SUMMARY OF THE INVENTION

Briefly the invention comprises a clamp circuit connected between the gate electrode of a bootstrap driver circuit and a voltage source for turning said bootstrap driver circuit off when the voltage level at the output of said bootstrap driver circuit reaches a predetermined voltage level. As a result of turning the bootstrap driver circuit off, the voltage at the output can increase. If the bootstrap driver circuit had not been turned off, the voltage level at the output would have been limited to the voltage level of the voltage source.

In a preferred embodiment, the bootstrap driver circuit comprises the load circuit for an inverter stage of a logic circuit providing the drive voltage levels to a push-pull output stage as a function of the logic state represented by input signals to the inverter stage. The logic circuit also includes a feedback control circuit connected between the output and the gate electrode of a first field effect transistor of the push-pull output stage for providing an increased drive voltage to the gate electrode of the first field effect transistor. The increased drive voltage enables the output to be driven to the voltage level of the voltage source whereby the threshold voltage of the first field effect transistor is overcome.

In order to achieve the desired clamping effects, the clamping field effect transistor is produced with a threshold voltage which is slightly less than the threshold voltage of the drive field effect transistor. As a result, the voltage on the gate electrode of the drive field effect transistor is less than one threshold greater than the voltage level of the voltage source. In other words, the clamping circuit clamps the gate electrode to a voltage level which is slightly less than one threshold greater than the voltage level of the voltage source. The gate electrode must be at a voltage level greater by at least one threshold less than the voltage level of the voltage source in order for the field effect transistor to become conductive. The clamp circuit thus enables the voltage level at the output of the driver circuit to increase to a voltage level which is greater than the voltage level of the voltage source. As a consequence, the threshold drop across the driver field effect transistor is eliminated and even if the voltage level of the voltage source is reduced, only one threshold drop is interposed between the output of the driver circuit and the output of the logic circuit.

Therefore, it is an object of this invention to provide a clamp circuit for a bootstrap driver circuit which enables the output of the bootstrap driver circuit to increase to a level in excess of the voltage source for the bootstrap driver circuit.

It is another object of this invention to provide an improved load circuit for a logic circuit which drives a push-pull output stage whereby a relatively lower value voltage source can be used without adversely effecting the output voltage level.

A still further object of this invention is to provide a logic gate having a push-pull output stage and an inverter stage in which the load field effect transistor of the inverter stage is implemented by a bootstrap driver circuit having a clamp field effect transistor connected between the gate electrode of the driver circuit and a voltage source for holding the driver circuit off when the voltage level at the output of the inverter stage increases to a level equivalent to the level of the voltage source.

A still further object of this invention is to provide a clamp circuit for a bootstrap driver circuit which eliminates the threshold drop across the bootstrap driver circuit without limiting the voltage level at the output of the driver circuit.

A still further object of this invention is to provide a logic circuit which incurs only two threshold voltage drops through a feedback control loop.

These and other objects of this invention will become more apparent when taken in connection with the description of the drawings, a brief description of which follows:

BRIEF DESCRIPTION OF THE DRAWINGS

The FIGURE is a schematic diagram of one embodiment of the clamp circuit used with a logic circuit which provides drive voltages for a push-pull output stage.

DESCRIPTION OF THE PREFERRED EMBODIMENT

The FIGURE illustrates inverter circuit 1 comprising the inverter stage of the circuit. The output from the inverter circuit at node 2 provides one of the inputs to the push-pull output stage 3. The other input is taken directly from the input 4 via line 5. The voltage level on output 6 is fedback through the feedback control circuit 7 to one plate of capacitor 8. The other plate of capacitor 8 is connected to the output node 2 of inverter circuit 1.

The push-pull output stage comprises field effect transistors 9 and 10 connected in electrical series between voltage source -V and electrical ground. Output 6 is taken from a common point between field effect transistors 9 and 10. The gate electrode of field effect transistor 9 is connected to the output node 2 of inverter circuit 1. The gate electrode of field effect transistor 10 is connected via line 5 to the input 4. It is pointed out that although P-channel field effect transistors using negative voltage levels representing a true logic state are described and shown in a preferred embodiment, other types of field effect transistors using the same or different logic conventions can also used within the scope of the invention.

The feedback control circuit 7 comprises field effect transistors 11 and 12 connected in electrical series between voltage source -V and electrical ground. The output from a common point 13 between the series connected field effect transistors provides a drive voltage to the gate electrode of field effect transistor 14. Field effect transistor 14 is in electrical series between the bootstrap driver circuit 15 and voltage source -V. One plate of the capacitor 8 is connected to the common point 16 between the driver circuit 15 and field effect transistor 14. The operation of the control circuit is described subsequently.

The inverter stage 1 comprises field effect transistor 17 which has its gate electrode connected to input terminal 4. The bootstrap driver circuit 18 is connected in electrical series with field effect transistor 17 between voltage source -V and electrical ground. Output node 2 is connected to a common point between the bootstrap driver circuit 18 and the field effect transistor 17. The clamp field effect transistor 19 is connected between the bootstrap driver circuit and voltage source -V. The gate electrode and drain electrode are connected to point 20. The source electrode is connected to terminal 21 for voltage source -V.

The bootstrap driver circuit 18 comprises a load field effect transistor 22 having capacitor 23 connected between its source electrode 24 and its gate electrode 25. The drain electrode 26 is connected to terminal 21 for voltage source -V. The capacitor precharge field effect transistor 28 is connected in electrical series between the gate electrode 25 of field effect transistor 22 and the voltage source -V. The gate electrode 27 and the drain electrode 29 of field effect transistor 28 are connected to voltage source, -V.

The clamping field effect transistor is produced with a threshold voltage level which is slightly less than the threshold voltage level of field effect transistor 22 of the bootstrap driver circuit 18. For example, the clamping field effect transistor may be produced with a width of one such that it has a threshold drop of approximately 7 volts. The load field effect transistor 22 on the other hand may be produced with a width of one-half such that it has a threshold voltage drop of approximately 8. The significance of the different threshold voltage levels is explained subsequently during the description of the operation of the circuit.

In operation, if the input is true, field effect transistor 17 is turned on and node 2 is clamped to electrical ground. Field effect transistor 28 is turned on for enabling capacitor 23 to charge to the voltage level of voltage source -V reduced by the threshold drop across the field effect transistor 28. The field effect transistor 10 of the push-pull output stage is also turned on so that the output 6 is clamped to electrical ground through field effect transistor 10. Since the output voltage level is less than a threshold voltage level, field effect transistor 12 of the feedback control circuit is held off and the control circuit does not provide a feedback to capacitor 8.

If the input on terminal 4 is false, field effect transistor 17 is turned off. The voltage at node 2 is fed-back across capacitor 23 to the gate electrode of field effect transistor 22 for boosting the voltage level on the gate electrode. As a result, the threshold drop across the field effect transistor is overcome and node 2 is driven to approximately the level of the voltage source. The voltage level on node 2 is provided to the gate electrode of field effect transistor 9 for turning the field effect transistor on. As a result, the output 6 is driven to the voltage level of the voltage source reduced by the threshold drop across field effect transistor 9. Since the output voltage level is in excess of a threshold voltage level, field effect transistor 12 is turned on and node 13 is held to electrical ground. Field effect transistor 14 is turned off and voltage level at 16 rises from the electrical ground voltage level to the voltage level of the voltage source. The voltage at point 16 is driven to the voltage level of the voltage source by the bootstrap circuit 15 which had its capacitor charged during the prior operating cycle.

Since the voltage level at node 16 changes from electrical ground to a negative voltage, the voltage across capacitor 8 also changes proportionately. Therefore, the voltage at node 2 becomes substantially more negative. However, with-out the clamp of field effect transistor 19, the voltage level at node 2 would be fed-back across capacitor 23 to the gate electrode of the field effect transistor 22. As a result, the increase at node 2 would be discharged through field effect transistor 22 and node 2 would be clamped to the voltage level of the voltage source, e.g., −25. However, because the threshold voltage drop of the clamp field effect transistor 19 is less than the threshold drop of field effect transistor 22, the gate electrode of field effect transistor 22 is clamped to a voltage level which is less than one voltage level more negative than the voltage level of -V for field effect transistor 22. For example, if the clamp field effect transistor has a threshold voltage of −7, the gate electrode of field effect transistor 22 would be clamped to −32 volts assuming a -V of −25 volts. Since the difference between −25 and −32 volts, (and assuming the threshold drop for field effect transistor 22 is −8 volts), there is insufficient voltage difference between the gate electrode and drain electrode to render field effect transistor 22 conductive. Therefore, the voltage at node 2 can continue to increase to a voltage level more negative than the voltage source -V. For example, the voltage level could become equal to approximately −35 volts for the values assumed. Since a voltage at node 2 becomes more negative than the source voltage by at least one threshold voltage drop, the voltage on the gate electrode of field effect transistor 9 is substantially increased. Therefore, the threshold drop across field effect transistor 9 is overcome and the output is driven to the full voltage level of the voltage source.

It is pointed out that even if the voltage of the voltage source -V is reduced by a threshold voltage value for low voltage operations, the bootstrap operation of bootstrap driver circuit 18 would initially overcome the threshold drop across field effect transistor 22. As a result, only two threshold drops, e.g., the threshold drop across field effect 9 and the threshold drop across the control circuit 7 would be interposed in the feedback loop. Therefore, the control circuit would still respond to the voltage at the output which be equal to at least one threshold voltage level. The normal operation of the circuit could then be achieved.

I claim:

1. A clamp circuit for a bootstrap field effect transistor driver including feedback capacitor between the output and gate electrode of the field effect transistor driver and a field effect transistor connected between a voltage source and the gate electrode of said bootstrap field effect transistor driver for precharging the feedback capacitor to a voltage level sufficient to turn said bootstrap field effect transistor driver on, said clamp circuit comprising, a clamping field effect transistor connected between the gate electrode of said bootstrap field effect transistor driver and said voltage source for responding to voltage levels feedback to the gate electrode of said bootstrap field effect transistor driver across said feedback capacitor, said clamping field effect transistor clamping said gate electrode to a voltage level for turning said bootstrap field effect transistor driver off.

2. The clamp circuit recited in claim 1 wherein said clamping field effect transistor has its gate electrode connected to the gate electrode of said bootstrap field effect transistor driver for becoming conductive when the voltage level on the gate electrode exceeds the voltage level of the voltage source by an amount equal to the threshold voltage of said clamping field effect transistor, said threshold voltage being less than the threshold voltage of said bootstrap field effect transistor driver whereby said boot-strap field effect transistor driver is turned off and the voltage level on the output electrode continues to increase to its maximum value without being clamped to the voltage level of the voltage source through said bootstrap field effect transistor driver.

3. The clamp circuit recited in claim 1 wherein said clamping field effect transistor has its gate electrode and one other electrode connected at a common point to the gate electrode of said bootstrap field effect transistor driver and having its other electrode connected to said voltage source.

4. The clamp circuit recited in claim 3 wherein said clamping field effect transistor is relatively wider than the bootstrap field effect transistor driver for having a lower threshold voltage, said lower threshold voltage enabling said clamping field effect transistor to clamp the gate electrode of said bootstrap field effect transistor to a voltage level which is insufficient to provide a threshold voltage difference between said voltage source and the voltage level on said gate electrode of said bootstrap field effect transistor driver.

5. The clamp circuit recited in claim 4 wherein said bootstrap field effect transistor driver is connected in series with a second field effect transistor for forming an inverter circuit, said output taken at a common point between said bootstrap field effect transistor driver and said second field effect transistor.

6. The clamp circuit recited in claim 5 and further including, a push-pull output stage comprising series connected field effect transistors, the output taken between said boot-strap field effect transistor driver and said second field effect transistor providing a drive voltage for a first field effect transistor of the push-pull output stage, a capacitor having one plate connected to the output of said bootstrap field effect transistor driver, a feedback control circuit connected between the field effect transistors of said push-pull output stage and the other plate of said capacitor for feeding voltage levels from said push-pull output stage when said first field effect transistor is conducting, whereby the voltage level at the output of said bootstrap field effect transistor and on the gate electrode of said first field effect transistor are increased to a voltage level for overcoming the threshold voltage drop across said first field effect transistor.

* * * * *